United States Patent
Shirota

(10) Patent No.: US 12,412,627 B2
(45) Date of Patent: Sep. 9, 2025

(54) FLASH MEMORY WITH HIGH INTEGRATION

(71) Applicant: Winbond Electronics Corp., Taichung (TW)

(72) Inventor: Riichiro Shirota, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 175 days.

(21) Appl. No.: 18/459,429

(22) Filed: Sep. 1, 2023

(65) Prior Publication Data

US 2024/0274196 A1   Aug. 15, 2024

(30) Foreign Application Priority Data

Feb. 15, 2023   (JP) .................. 2023-021320

(51) Int. Cl.
*G11C 16/00*   (2006.01)
*G11C 5/06*    (2006.01)
(Continued)

(52) U.S. Cl.
CPC .......... *G11C 16/0483* (2013.01); *G11C 5/063* (2013.01); *G11C 16/14* (2013.01);
(Continued)

(58) Field of Classification Search
CPC . G11C 16/0483; G11C 16/10; G11C 16/0433; G11C 16/14; G11C 16/24; G11C 16/0466; G11C 16/16; G11C 16/00; G11C 16/02; G11C 16/102; G11C 16/34; G11C 11/5642; G11C 16/0416; G11C 16/08; G11C 5/063; G11C 11/5621; G11C 11/5628; G11C 11/5635; G11C 16/0491;
(Continued)

(56) References Cited

U.S. PATENT DOCUMENTS 6,839,278 B1 *  1/2005  Lee ............... H10B 20/65
                                          365/185.33
11,152,386 B2  10/2021  Or-Bach et al.

FOREIGN PATENT DOCUMENTS

| CN | 108701475   | 4/2022 |
| JP | 2007103640  | 4/2007 |
| TW | I451562     | 9/2014 |

OTHER PUBLICATIONS

"Office Action of Korea Counterpart Application", issued on Apr. 28, 2025, p. 1-p. 5.

* cited by examiner

Primary Examiner — Thong Q Le
(74) Attorney, Agent, or Firm — JCIPRNET

(57) ABSTRACT

An AND-type flash memory capable of achieving high integration after providing a miniaturized memory cell size includes: a plurality of diffusion regions (70) formed in a substrate in a column direction, a plurality of gates (20) formed between the opposite diffusion regions (70), a selection control line (SGD), a selection control line (SGS), and a plurality of word lines (WL0 to WLn-1). The selection control line (SGD) is connected to each gate of a bit line side selection transistor. The selection control line (SGS) is connected to each gate of a source line side selection transistor. The word lines (WL0 to WLn-1) are connected to gates of memory cells. Each of the bit line side selection transistor, the source line side selection transistor, and the plurality of memory cells has a channel area in the row direction.

16 Claims, 16 Drawing Sheets

(51) Int. Cl.
  *G11C 16/04*  (2006.01)
  *G11C 16/14*  (2006.01)
  *G11C 16/24*  (2006.01)
  *H10B 41/27*  (2023.01)
  *H10B 43/27*  (2023.01)
(52) U.S. Cl.
  CPC ............. *G11C 16/24* (2013.01); *H10B 41/27* (2023.02); *H10B 43/27* (2023.02)
(58) Field of Classification Search
  CPC .... G11C 2211/5641; G11C 2211/5642; G11C 5/025; G11C 16/06; G11C 16/26; G11C 16/28; G11C 16/3404; G11C 16/3409; G11C 16/3413; G11C 16/3459; G11C 17/12; G11C 7/18; G11C 11/005; G11C 16/3418; G11C 16/3427; G11C 17/126; G11C 2207/2227; G11C 5/14; G11C 7/12; G11C 7/22; H10B 69/00; H10B 41/30; H10B 41/35; H10B 43/30; H10B 43/35; H10B 43/40; H10B 41/10; H10B 41/40; H10B 43/27; H10B 43/10; H10B 41/27; H10B 43/20; H10B 41/20; H10B 41/41; H10B 41/50; H10B 43/50; H10B 12/482; H10B 12/488; H10B 20/00; H10B 20/38; H10B 20/65; H10B 41/49; H10B 51/20; H10B 20/383; H10B 41/00; H10B 41/42; H01L 2924/1443; H01L 21/28123; H01L 21/76224
  See application file for complete search history.

(Releated Art)

|  | Read (connected to CG1) | Write (connected to CG1) | Erasure of selected blocks |
|---|---|---|---|
| BL1 | High (up to 0.6 V) | '0':0V, '1':~1.6V | Floating |
| BL2 | High (up to 0.6 V) | '0':0V, '1':~1.6V | Floating |
| SL1 | 0~0.2V | Same as BL1 | Floating |
| SL2 | 0~0.2V | Same as BL2 | Floating |
| SGS | High (up to 1.5 V) | ~1.5V | Floating |
| SGD | High (up to 1.5 V) | High (up to 1.5 V) | Floating |
| CG0 | −0.6~0V | High (5 V to 7 V) | 0V |
| CG1 | 4V | High (8 V to 14 V) | 0V |
| CGn−2 | −0.6~0V | High (5 V to 7 V) | 0V |
| CG1n−1 | −0.6~0V | High (5 V to 7 V) | 0V |
| SGS | 0V | 0V | Floating |
| SGD | 0V | 0V | Floating |
| CG0 | 0V | 0V | Floating |
| CG1 | 0V | 0V | Floating |
| CGn−2 | 0V | 0V | Floating |
| CG1n−1 | 0V | 0V | Floating |
| p well/ n well | 0V | 0V | High (8 V to 14 V) |

Selected blocks: SGS, SGD, CG0, CG1, CGn−2, CG1n−1 (first group)
Unselected blocks: SGS, SGD, CG0, CG1, CGn−2, CG1n−1 (second group)

FIG. 15B

| | Read (connected to CG1) | Write (connected to CG1) | Erasure of selected blocks |
|---|---|---|---|
| BL1 | High (up to 0.6 V) | '0':0V, '1':~1.6V | Floating |
| BL2 | High (up to 0.6 V) | '0':0V, '1':~1.6V | Floating |
| SL1 | 0~0.2V | 0.5~1V | Floating |
| SGS | High (up to 1.5 V) | 0V | Floating |
| SGD | High (up to 1.5 V) | High (up to 1.5 V) | Floating |
| CG0 | −0.6~0V | High (5 V to 7 V) | 0V |
| CG1 | 4V | High (8 V to 14 V) | 0V |
| CGn−2 | −0.6~0V | High (5 V to 7 V) | 0V |
| CG1n−1 | −0.6~0V | High (5 V to 7 V) | 0V |
| SGS | 0V | 0V | Floating |
| SGD | 0V | 0V | Floating |
| CG0 | 0V | 0V | Floating |
| CG1 | 0V | 0V | Floating |
| CGn−2 | 0V | 0V | Floating |
| CG1n−1 | 0V | 0V | Floating |
| p well/ n well | 0V | 0V | High (8 V to 14 V) |

FIG. 21

FLASH MEMORY WITH HIGH INTEGRATION

CROSS-REFERENCE TO RELATED APPLICATION

This application claims the priority benefit of Japan application serial no. 2023-021320, filed on Feb. 15, 2023. The entirety of the above-mentioned patent application is hereby incorporated by reference herein and made a part of this specification.

BACKGROUND

Technical Field

The disclosure relates to a flash memory with an AND-type memory unit array structure.

Description of Related Art

In FIG. 1, (A) represents an equivalent circuit of a conventional NOT OR (NOR)-type flash memory. As shown in (A) of FIG. 1, the source/drain of each memory cell is connected between the bit line BL and the source line SL (virtual ground), and the gate is connected to the word line WL for reading or programming of each memory cell. In the programming operation, for example, 5 V is applied to the bit line BL of the selected memory cell, 0 V is applied to the source line SL, 12 V is applied to the word line WL, and 0 V is applied to the bit line BL, the source line SL, and the word line WL of the unselected memory cell.

In the NOR-type flash memory, there is a limitation in scaling the memory cell due to the inability to scale the gate length of the memory cell to less than 100 nm. One of the reasons for not being able to scale the gate length is the punch-through problem during programming. Due to the large voltage applied to the bit line BL, if the gate length is less than 100 nm according to scaling, a punch-through occurs between the source and the drain of the memory cell, and the leakage of current from the bit line BL to the source line SL becomes difficult to suppress. Further, when the gate length cannot be scaled, the channel width for obtaining the read current during the read operation cannot be scaled either. Therefore, the memory cell size of the NOR-type flash memory has roughly reached the limit.

In FIG. 1, (B) is a diagram representing an equivalent circuit of an AND-type flash memory. In the AND-type flash memory, a plurality of memory cells are connected in parallel between the local bit line LBL and the local source line LSL, and the gates of the memory cells are connected to the word lines WL. The local bit line LBL is connected to the bit line BL through the bit line side selection transistor, and the local source line LSL is connected to the source line SL through the source line side selection transistor. When selecting a memory cell, bit line side selection transistor is turned on by the selection control line SG1, and the source line side selection transistor is turned on by the selection control line SG2.

In the programming operation, for example, 4.5 V is applied to the local bit line LBL of the selected memory cell to float the local source line LSL, −9.5 V is applied to the word line WL and 0 V is applied to the local bit line LBL of the unselected memory cell to float local source line LSL, and 3 V is applied to the word line WL.

SUMMARY

Problems to be Addressed by the Disclosure

In a conventional AND-type flash memory, during a programming operation, the local source line LSL is floated, and electrons are discharged from the floating gate FG to the drain by utilizing a potential difference between the drain and the floating gate. At this time, if the gate length is miniaturized, the source potential increases due to the punch-through effect between the source and the drain, and the potential of the floating gate FG increases due to the capacitance between the source and the floating gate. Therefore, it is difficult to discharge electrons from the floating gate FG to the local bit line LBL through the drain. Therefore, it is difficult to miniaturize the cell size.

The disclosure provides an AND-type flash memory including a memory cell array. The memory cell array includes a plurality of memory cells, and the plurality of memory cells are connected in parallel between a source line and a bit line. The AND-type flash memory includes a plurality of diffusion regions, a plurality of gates, a first selection control line, a second selection control line, and a plurality of word lines. The plurality of diffusion regions are formed in a substrate in a column direction. The plurality of gates are formed between the opposite diffusion regions. The first selection control line is connected to each gate of a bit line side selection transistor in a row direction. The second selection control line is connected to each gate of a source line side selection transistor in the row direction. The plurality of word lines are connected to gates of the memory cells in the row direction. Each of the bit line side selection transistor, the source line side selection transistor, and the plurality of memory cells has a channel area in the row direction.

In an embodiment, diffusion regions of the bit line side selection transistor and the source line side selection transistor are separated from diffusion regions of the plurality of memory cells. In an embodiment, the diffusion regions comprise a first isolation region and a second isolation region. The first isolation region electrically isolates a diffusion region of the bit line side selection transistor from a diffusion region of the memory cell adjacent to the bit line side selection transistor. The second isolation region electrically isolates a diffusion region of the source line side selection transistor from a diffusion region of the memory cell adjacent to the source line side selection transistor. In an embodiment, the first isolation region and the second isolation region have a different conductivity type from other diffusion regions. In an embodiment, the flash memory further includes a plurality of bit lines and a plurality of source lines formed on the substrate along the diffusion regions. The bit lines are electrically connected to a diffusion region of the bit line side selection transistor through a contact member. The source lines are electrically connected to a diffusion region of the source line side selection transistor through a contact member. In an embodiment, the diffusion regions include a metal silicide region. In an embodiment, an element isolation region is formed between two opposite diffusion regions in each of the memory cells and two opposite diffusion regions in another memory cell adjacent to the memory cell. In an embodiment, each of the memory cell includes a stacked insulator comprising at least three layers or more between the gate and the substrate, and the stacked insulator comprises a charge storage layer. In an embodiment, the stacked insulators are separated in units of each memory cell. In an embodiment, when a program voltage is applied to a gate of a selected memory cell, the charge storage layer stores charges from a channel through Fowler-Nordheim (FN) punch-through. In an embodiment, when an erase voltage is applied to a well region, the charge storage layer releases stored charges into a channel through punch-through.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 15B is a table representing setting examples of application of operating bias voltages to each part of the AND-type flash memory according to this embodiment.

FIG. 21 is a table representing setting examples of application of operating bias voltages to each part of the AND-type flash memory according to another embodiment of the disclosure.

DESCRIPTION OF THE EMBODIMENTS

Figure 1:
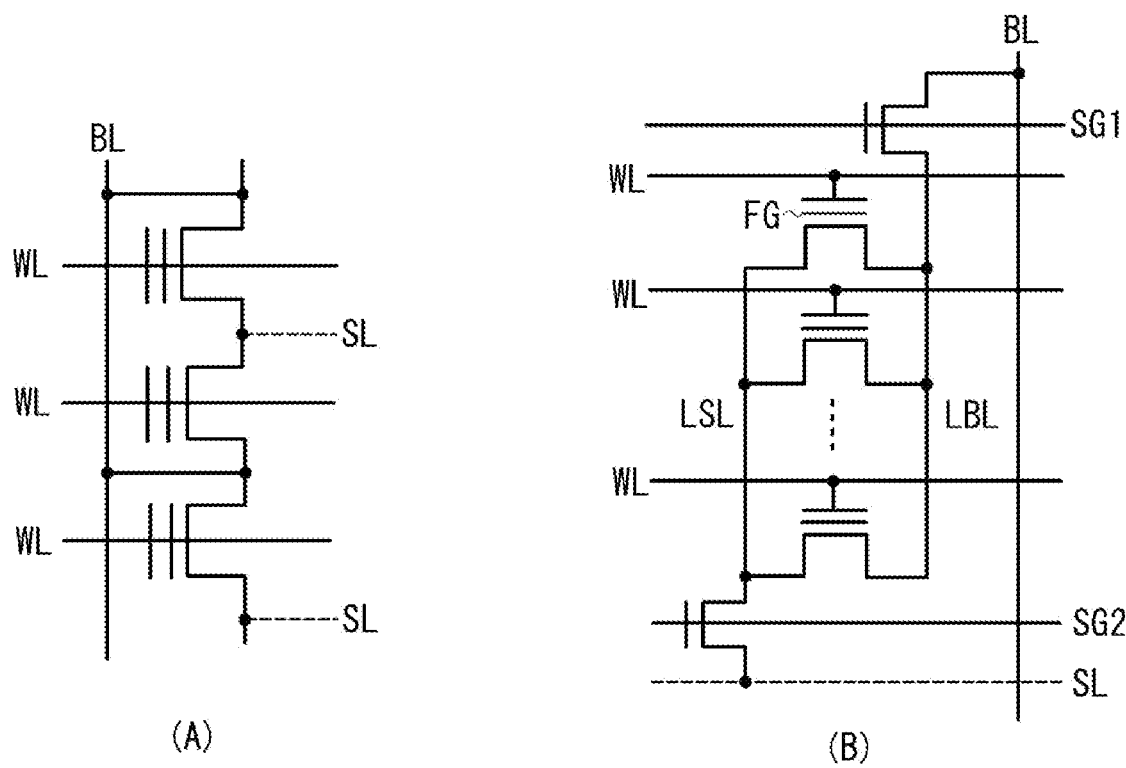
In FIG. 1, (A) is an equivalent circuit of a NOR-type flash memory, and (B) is an equivalent circuit of an AND-type flash memory.

In this embodiment, the equivalent circuit of this AND-type flash memory is the same as the equivalent circuit of the AND-type flash memory shown in (B) of FIG. 1, but the structure of the memory cell array, the structure of the memory cells, and the read/programming/erasure are different from that of conventional ones.

Figure 2A:
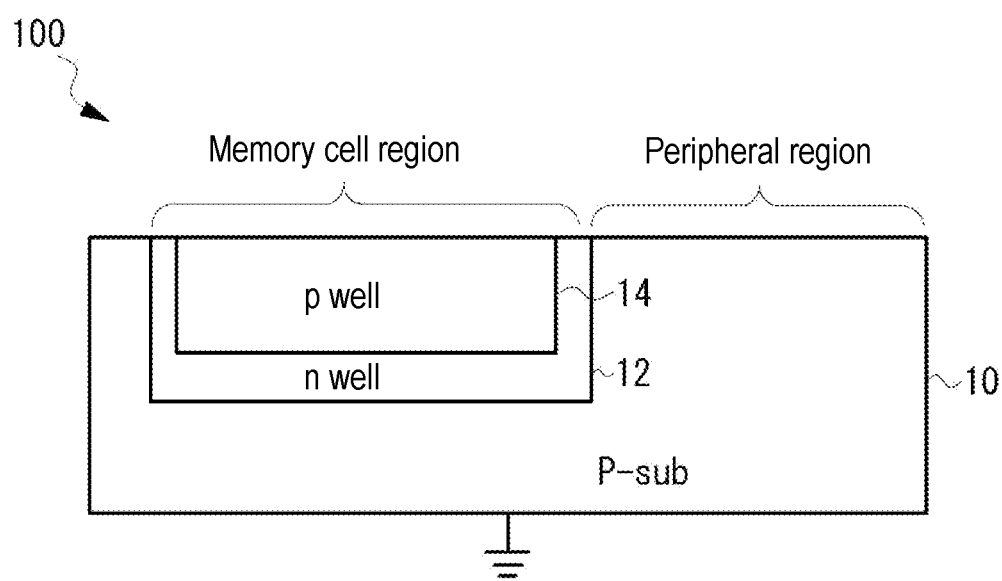
FIG. 2A is a schematic cross-sectional view of a substrate of an AND-type flash memory according to an embodiment of the disclosure.

FIG. 2A is a schematic cross-sectional view representing a well structure of an AND-type flash memory according to an embodiment of the disclosure. In this embodiment, a flash memory 100 includes a p-type silicon substrate 10, an n well 12 is formed on the silicon substrate 10, and a p well 14 is formed in the n well 12. The p well 14 provides a region for forming memory cells, and other p-type silicon regions form regions for forming peripheral circuits. Alternatively, an N-type silicon substrate may also be used, and in this case, the order of the two wells is reversed. The n well 12 is electrically connected to the p well 14, and a high voltage is applied to the two wells 12 and 14 during the erasing process. In addition, as shown in the bias voltage table of FIG. 15B, in other operations, the two wells 12 and 14 are grounded, and the P-type silicon substrate 10 is always kept grounded.

Figure 2B:
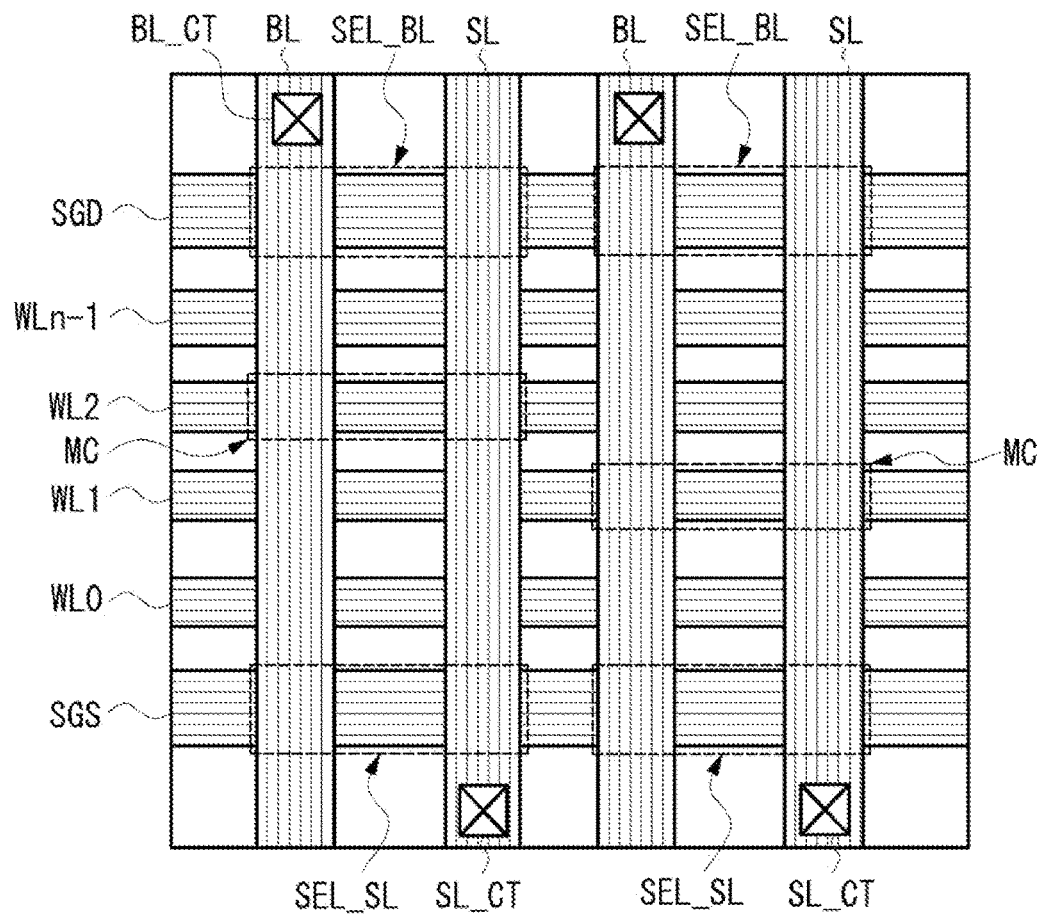
FIG. 2B is a schematic plan view of a memory cell array portion of the AND-type flash memory according to an embodiment of the disclosure.

FIG. 2B is a top view of part of a memory cell array of the AND-type flash memory according to an embodiment of the disclosure. On the substrate constituting the memory cell array, a plurality of elongated bit lines BL and a plurality of source lines SL are arranged in a column direction in an alternating manner. Below the substrate, a plurality of elongated word lines WL0, WL1, . . . , and WLn-1, a selection control line SGD, and a selection control line SGS extending in a row direction are formed. The plurality of word lines WL0 to WLn-1 are disposed between the selection control line SGD and the selection control line SGS.

Figure 16:
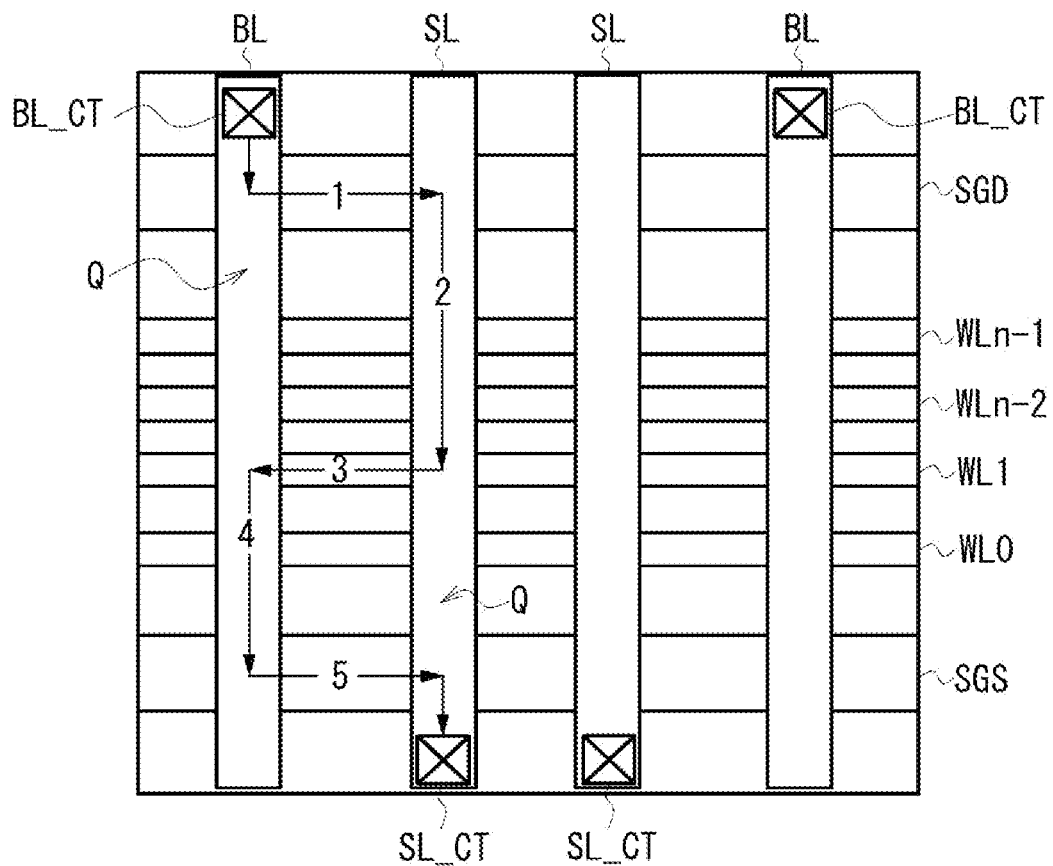
FIG. 16 is a diagram of a current path during a read operation of the AND-type flash memory according to this embodiment.

The source lines SL and the bit lines BL are made of, for example, a metal layer. Each source line SL has a contact member SL_CT, and the contact member SL_CT is electrically connected to one of the diffusion regions (or metal silicide regions) of a source line side selection transistor. Each bit line BL has a contact member BL_CT, and the contact member BL_CT is electrically connected to one of the diffusion regions (or metal silicide regions) of a bit line side selection transistor. In the example shown in the figure, the contact members SL_CT of the source lines and the contact members BL_CT of the bit lines are arranged in an alternating manner, but the disclosure is not limited thereto, and the contact members may also be arranged as shown in FIG. 16.

The selection control line SGD/selection control line SGS and the word lines WL are formed of, for example, a conductive polysilicon layer. The gates of the source line side selection transistors in the row direction are connected to the corresponding selection control line SGS together, and the gates of the bit line side selection transistors are connected to the corresponding selection control line SGD together. In addition, the gates of the memory cells in the row direction are connected to the corresponding word lines WL together.

A rectangular area indicated by a dotted line in FIG. 2B represents one memory cell MC, and other rectangular areas represent a source line side selection transistor SEL_SL and a bit line side selection transistor SEL_BL. The source line side selection transistor SEL_SL and the bit line side selection transistor SEL_BL have the same channel area in the row direction as the memory cell MC, in other words, have source/drain electrodes in the row direction.

Figure 3:
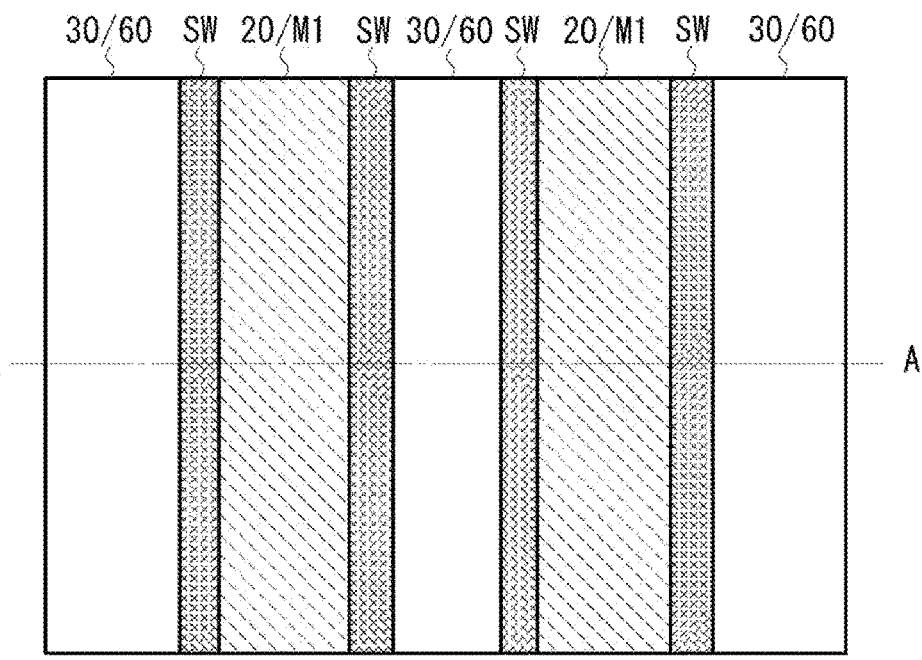
FIG. 3 represents a plan view of manufacturing steps of the AND-type flash memory and is a schematic plan view of the memory cell array portion according to an embodiment of the disclosure.

Next, details are going to be described with reference to a manufacturing method of the AND-type flash memory of this embodiment. FIG. 3 is a top view of part of the memory cell array. In FIG. 3, a plurality of gate materials 20 in the column direction formed on the substrate and side walls SW formed on side surfaces of the gate materials 20 are shown. Further, the blank portions are trenches 30 or element isolation regions 60 formed in the substrate.

Figure 4:
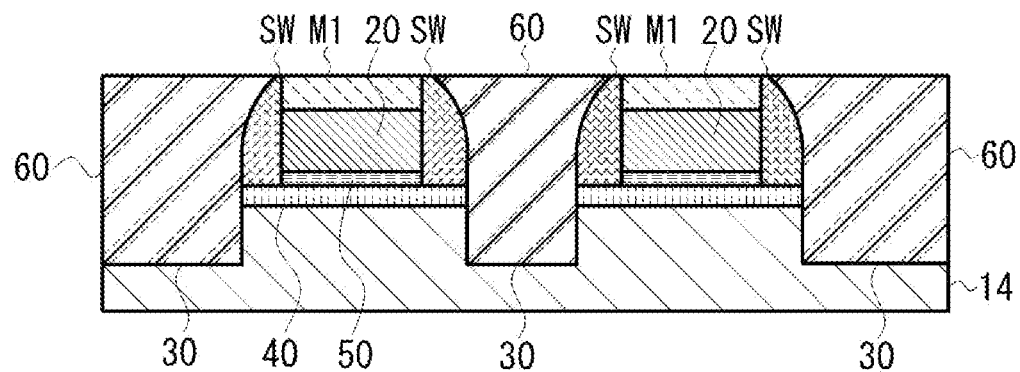
FIG. 4 is a cross-sectional view taken along the line A-A in FIG. 3 after an element isolation region is formed.

FIG. 4 is a cross-sectional view of FIG. 3 taken along a line A-A. After the n well 12 and the p well 14 are formed on the silicon substrate 10, P-type impurities such as boron are injected into the surface of the silicon substrate to form a P-type injection layer 40. The P-type injection layer 40 may adjust threshold values Vt of the memory cells MC, the bit line side selection transistor SEL_BL, and the source line side selection transistor SEL_SL. Further, as to be described in the following paragraphs, the P-type injection layer 40 electrically isolates diffusion regions of the bit line side selection transistor SEL_BL and the source line side selection transistor SEL_SL from diffusion regions of the of memory cells MC.

Next, a stacked insulator 50 in which at least three or more insulating films are stacked is deposited as a gate insulating film. The stacked insulator 50 includes a charge storage layer (e.g., SiN) sandwiched by insulating films, for example, composed of a silicon oxide-nitride-oxide (ONO) structure ($SiO_2/SiN/SiO_2$). During programming, the charge storage layer stores electrons from the channel through FN punch-through, for example.

As such, after the gate materials 20 such as polysilicon and a mask material M1 (e.g., resist, silicon oxide film, silicon nitride film, etc.) are evaporated, as shown in FIG. 3, the mask material M1, the gate materials 20, and the stacked insulator 50 are patterned into vertical stripes. At this time, the P-type injection layer 40 remains without being etched.

Next, a side wall material is deposited on the entire surface of the substrate, and the side wall material is anisotropically etched so that the side wall material remains on the side surfaces of the gate materials 20 and the mask material M1 to form the side walls SW. Next, the surface of the silicon substrate is etched using the side walls SW and the mask material M1 as a mask, and grooves (trenches 30) for element isolation are formed as shown in FIG. 4. The P-type injection layer 40 remains directly under the side walls SW and the stacked insulator 50. Next, an interlayer insulating film (e.g., a silicon oxide film, etc.) 60 is deposited on the entire surface of the substrate, and then the interlayer insulating film 60 is planarized (e.g., chemical mechanical polishing (CMP)) to expose a top portion of the mask material M1. The interlayer insulating film 60 formed on the trenches 30 becomes an element isolation region.

Figure 5:
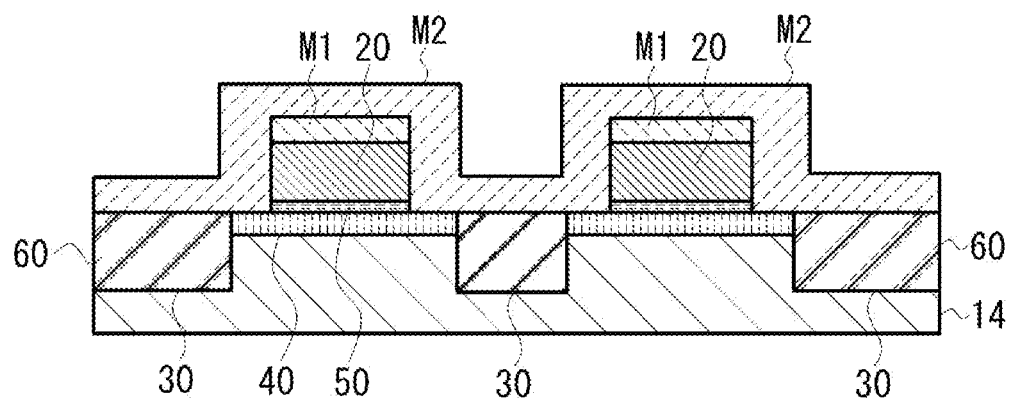
FIG. 5 is a cross-sectional view taken along the line A-A in FIG. 3 after a mask material M2 is formed on an entire surface.

After the planarization of the interlayer insulating film 60, as shown in FIG. 5, the interlayer insulating film 60 and the side walls SW are etched until the silicon surface and the P-type injection layer 40 are exposed. As such, a portion of the P-type injection layer 40, which is a region covered by the side walls SW, is exposed. Next, as shown in FIG. 5, a mask material M2 (e.g., a resist, a silicon oxide film, a silicon nitride film, etc.) is deposited on the entire surface of the substrate.

Figure 6:
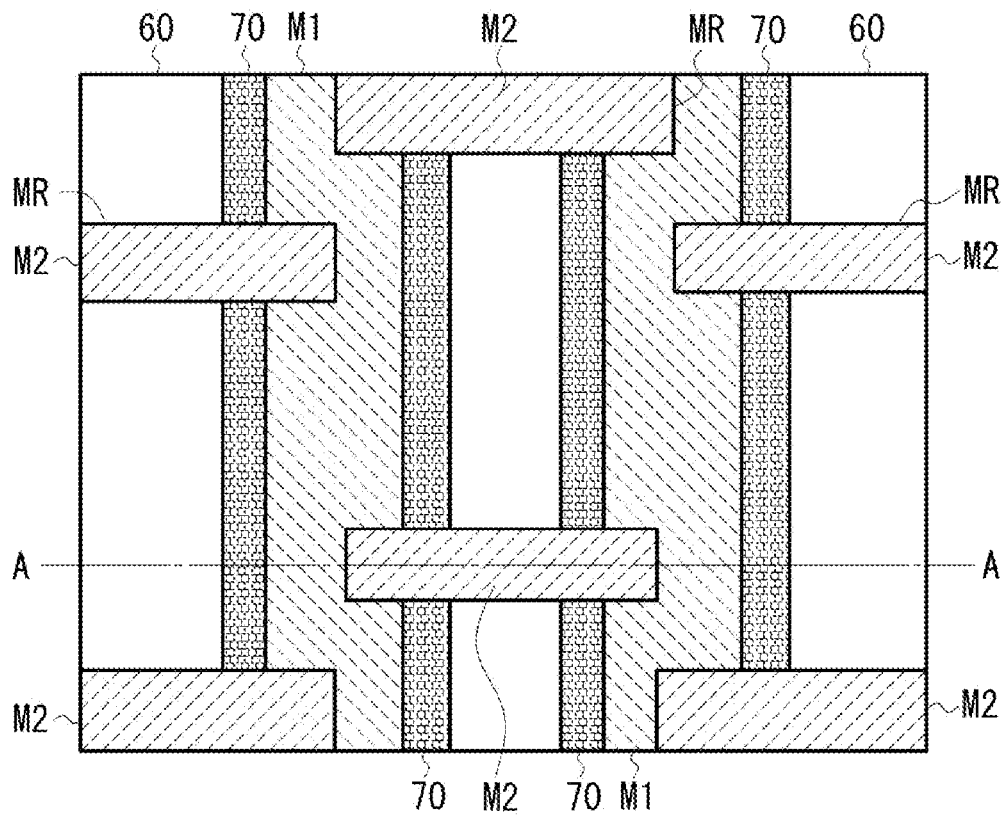
FIG. 6 is a schematic plan view of the memory cell array portion after an N-type impurity diffusion layer is formed.
Figure 7:
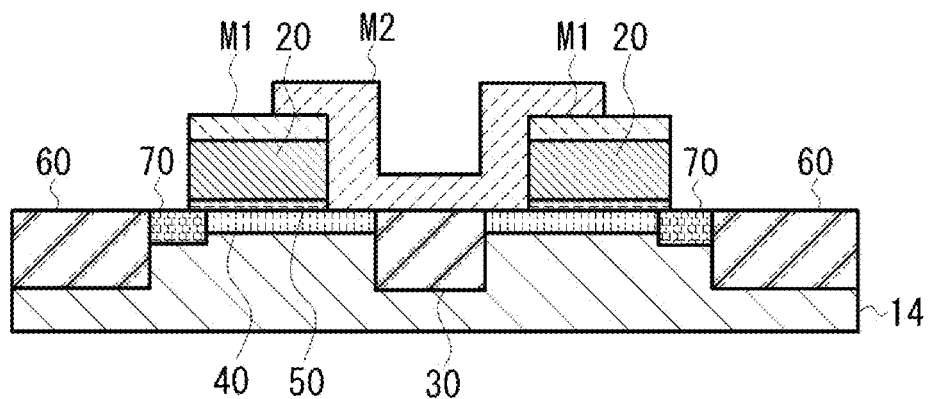
FIG. 7 is a cross-sectional view of FIG. 6 taken along the line A-A.

Next, as shown in FIG. 6, the mask material M2 is partially etched to leave the mask material M2 in the region of the rectangle MR. FIG. 7 is a cross-sectional view taken along a line A-A in FIG. 6 after the mask material M2 is etched. After the mask material M2 is etched, the mask material M2 is used for a mask, and ion implantation of high-concentration N-type impurities (e.g., phosphorus or arsenic) is performed. As such, N-type diffusion regions 70 are formed on the surface of the silicon substrate except the regions covered by the interlayer insulating film 60, the mask material M1, and the mask material M2. The N-type diffusion regions 70 provide the sources/drains of the memory cells, the bit line side selection transistor, and the source line side selection transistor.

The region covered by the mask material M2 is the P-type injection layer 40, so the N-type diffusion regions 70 are physically separated by the P-type injection layer 40. That is, the mask material M2 defines a region for separating the N-type diffusion regions 70 of the bit line side selection transistor and the source line side selection transistor from the N-type diffusion regions 70 of the memory cells.

In a preferred configuration, after the N-type diffusion regions 70 are formed, a high-melting-point metal (e.g., cobalt or nickel) is deposited on the entire surface of the substrate, followed by heat treatment to form a metal silicide region (e.g., $CoSi_2$ or NiSi) on the surface of the N-type diffusion regions 70. By silicidating the surface of each N-type diffusion region 70, the resistance of the N-type diffusion region 70 is reduced. Unreacted refractory metal is then removed by etching. It should be noted herein that a salicide process is used in which a metal silicide region is self-aligned and formed in the N-type diffusion region 70 exposed on the surface of the silicon substrate.

Figure 8:
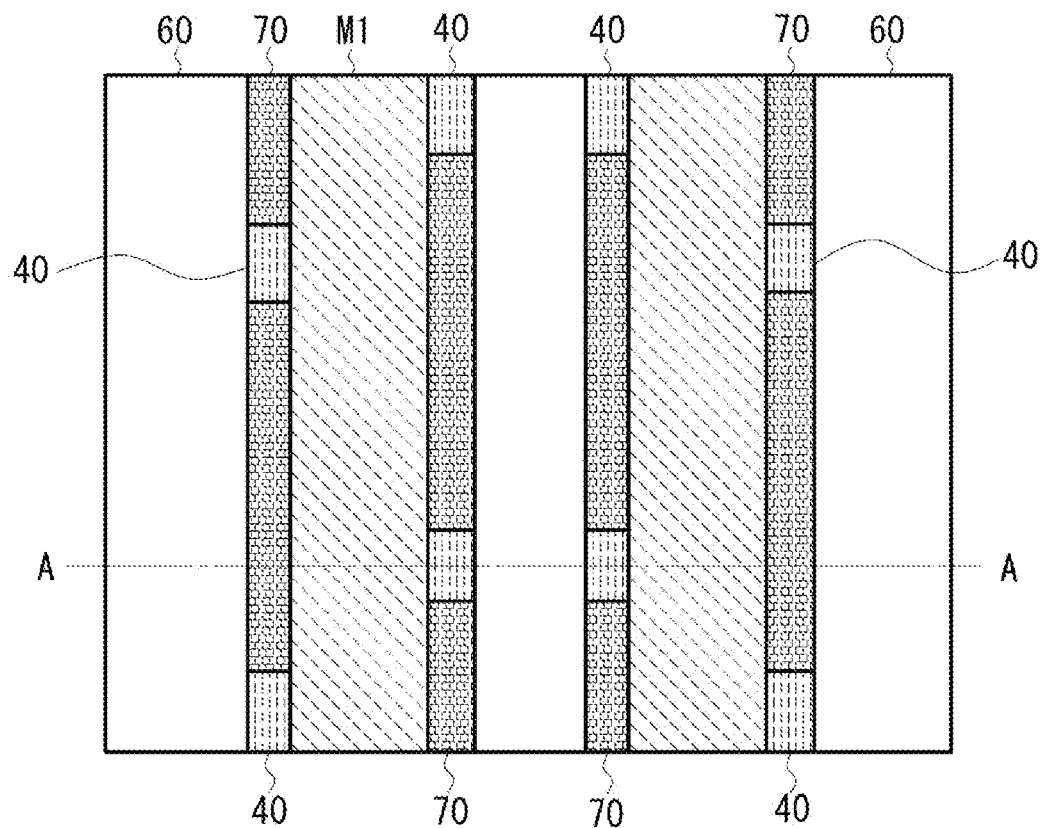
FIG. 8 is a schematic plan view of the memory cell array portion after the mask material M2 is removed.
Figure 9:
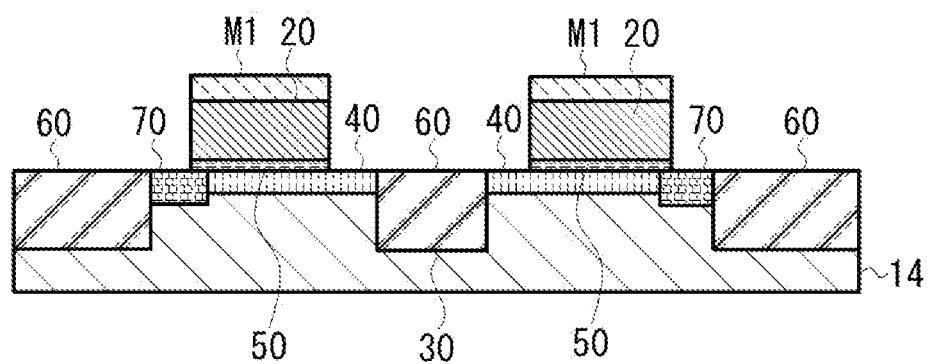
FIG. 9 is a cross-sectional view of FIG. 8 taken along the line A-A.

After the metal silicide region is formed in the N-type diffusion region 70, the mask material M2 is removed. A plan view at this time is shown in FIG. 8. The region covered by the mask material M2 is the P-type injection layer 40, and the N-type diffusion regions 70 are electrically isolated by the middle P-type injection layer 40. FIG. 9 is a cross-sectional view of FIG. 8 taken along the line A-A.

Figure 10:
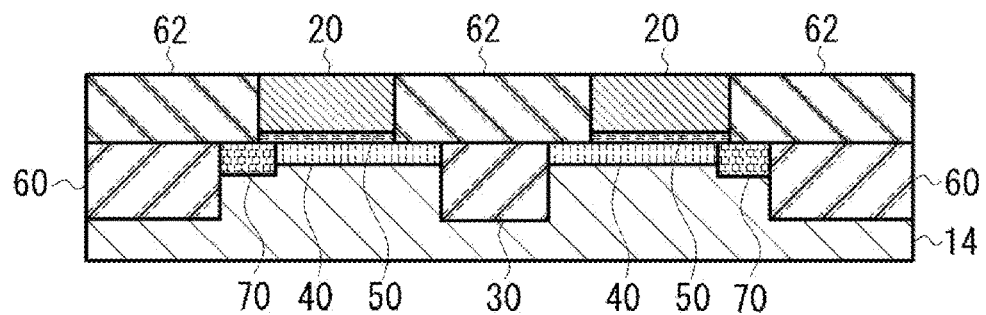
FIG. 10 is a cross-sectional view taken along the line A-A in FIG. 8 after an interlayer insulating film is formed.
Figure 11:
FIG. 11 is a schematic plan view of the memory cell array portion after a metal material is formed on an entire surface of the substrate.
Figure 12:
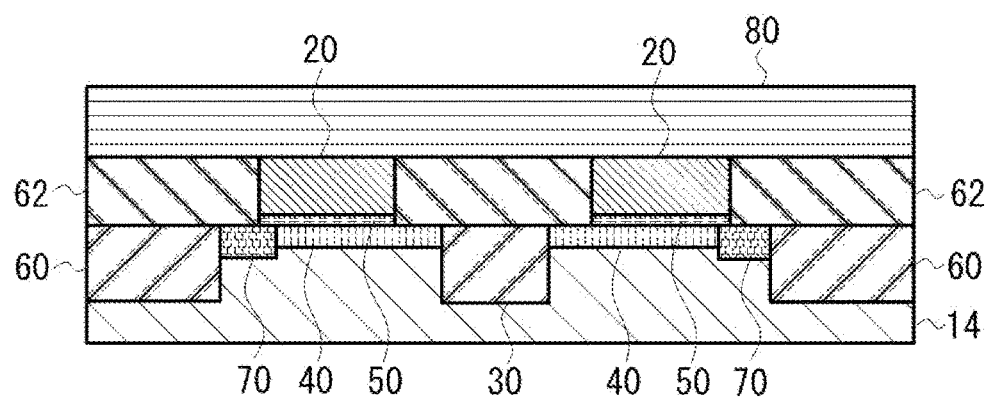
FIG. 12 is a cross-sectional view of FIG. 11 taken along the line A-A.

Next, as shown in FIG. 10, an interlayer insulating film 62 (e.g., a silicon oxide film, etc.) is deposited on the entire surface of the substrate, and then the interlayer insulating film 62 is planarized until the gate materials 20 are exposed. Next, as shown in FIG. 11, metal materials 80 are deposited on the entire surface of the substrate. FIG. 12 is a cross-sectional view of FIG. 11 taken along the line A-A. The metal material 80 is electrically connected to the gate materials 20.

Figure 13:
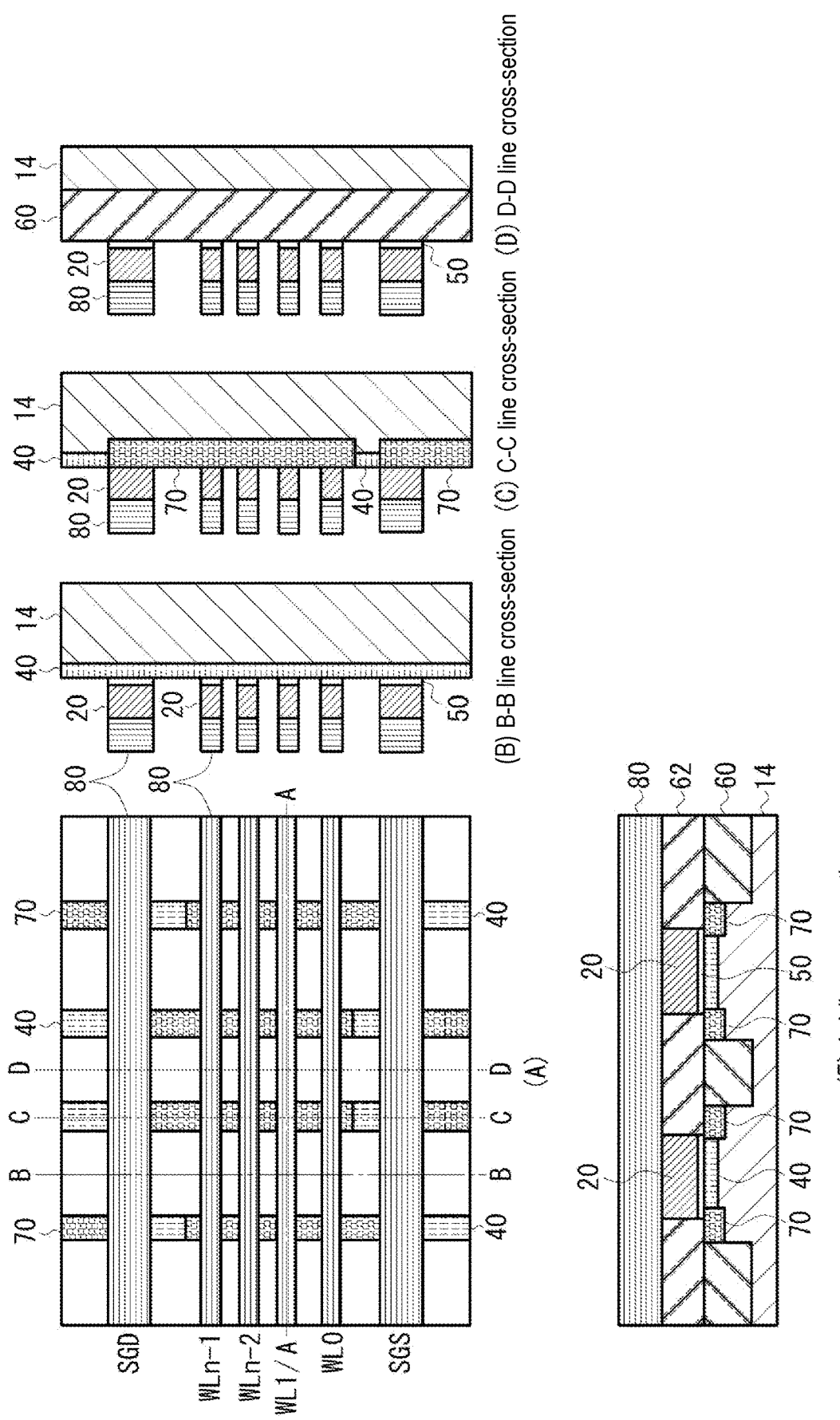
In FIG. 13, (A) is a schematic plan view of the memory cell array portion after the metal material is patterned, (B) is a cross-sectional view taken along the line B-B in (A), (C) is a cross-sectional view taken along the line C-C in (A), (D) is a cross-sectional view taken along the line D-D in (A), and (E) is a cross-sectional view taken along the line A-A in (A).
Figure 13A:
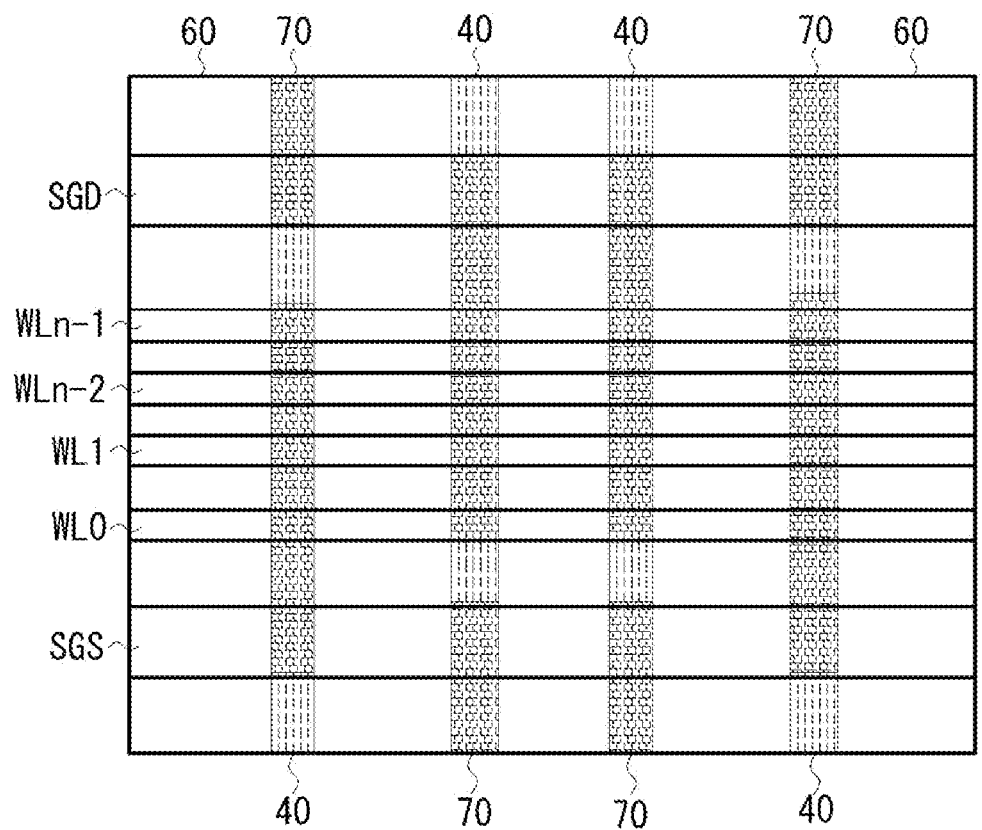
FIG. 13A is a schematic plan view schematically representing a relationship between a selection control line SGD/selection control line SGS and a diffusion region.

Next, the metal material 80, the gate materials 20, and the stacked insulators 50 are etched together. As shown in (A) to (E) of FIG. 13, the selection control line SGD/selection control line SGS, the word line WL0 to the word line WLn-1, the bit line side selection transistor, the source line side selection transistor, and the memory cells are formed. In FIG. 13, (A) is a top view of the memory cell array portion, (B) is a cross-sectional view taken along the line B-B in (A), (C) is a cross-sectional view taken along the line C-C in (A), (D) is a cross-sectional view taken along the line D-D in (A), and (E) is a cross-sectional view taken along the line A-A in (A). In addition, FIG. 13A schematically shows a positional relationship when the selection control line SGD/selection control line SGS and the word line WL0 to the word line WLn-1 overlap the N-type diffusion regions 70 and the P-type injection layers 40.

As shown in (E) of FIG. 13, the patterned gate materials 20 become the gates of the transistors, the stacked insulator 50 becomes the gate insulating film, the N-type diffusion regions 70 act as the sources/drains, and the silicon region directly under the stacked insulator 50 acts as a channel. In addition, the patterned metal material 80 becomes the selection control line SGD/selection control line SGS and the word lines WL. The selection control line SGD/selection control line SGS is electrically connected to the gate materials 20 of the bit line side selection transistor and the source line side selection transistor, and the word line WL0 to the word line WLn-1 disposed between the selection control line SGD and the selection control line SGS are electrically connected to the gate material 20 of the memory cell.

In FIG. 13, (C) shows the N+ diffusion regions 70, and (D) shows the element isolation region 60 that isolates the memory cells in the row direction and extends in the column direction. In FIG. 13, (E) shows two memory cells in the row direction. Further, as shown in FIG. 13A, one of the N-type diffusion regions 70 of the bit line side selection transistor is separated from one of the N-type diffusion regions 70 of the memory cell by the P-type injection layer 40. Another N-type diffusion region 70 of the source line side selection transistor is separated from another N-type diffusion region 70 of the memory cell by the P-type injection layer 40.

Figure 14:
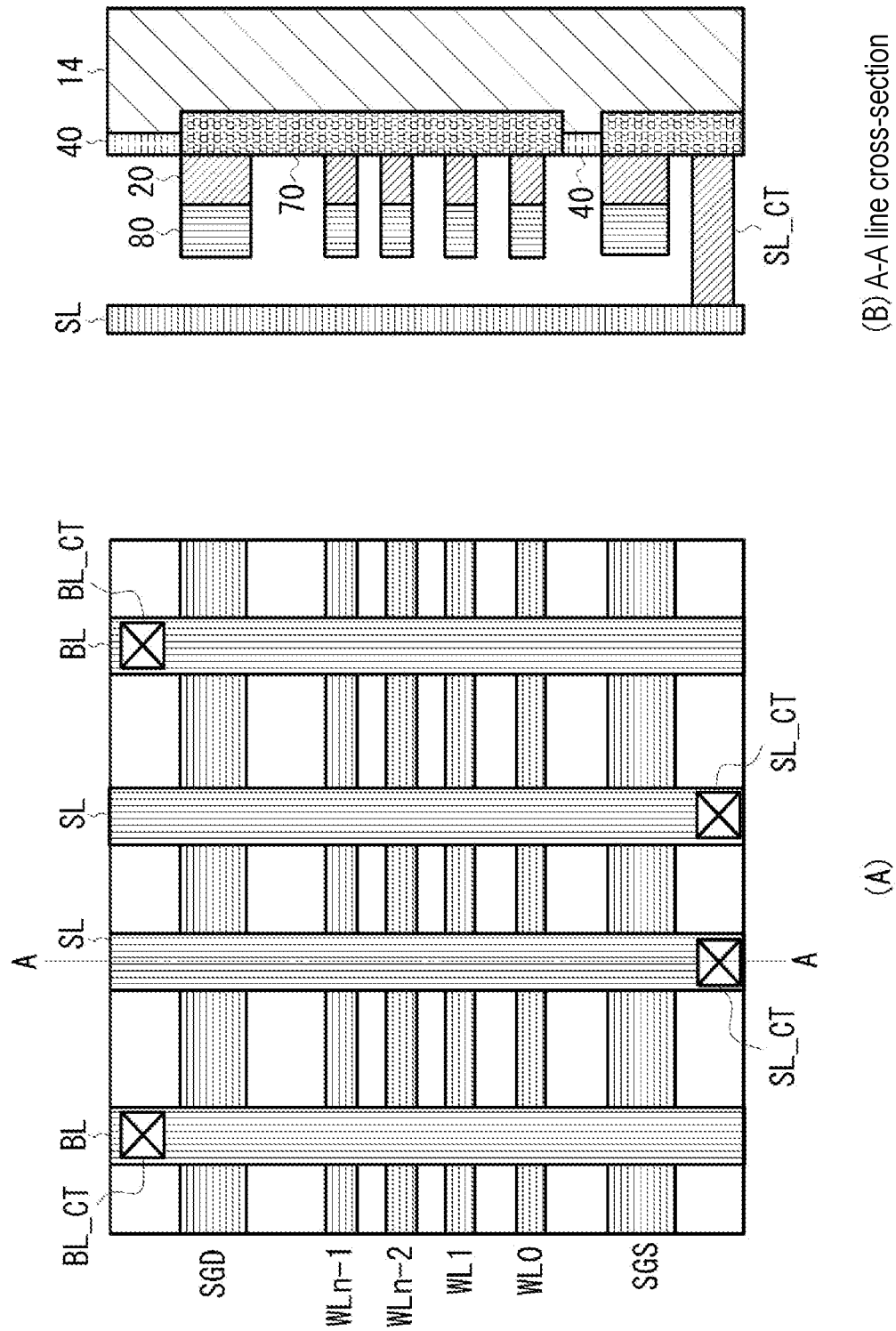
In FIG. 14, (A) is a schematic plan view of the memory cell array portion after bit lines and source lines are formed, and (B) is a cross-sectional view taken along the line A-A in (A).

Next, the spaces between the plurality of word lines and the spaces between the word lines and the selection control line SGD/selection control line SGS are filled with the interlayer insulating film. As such, as shown in (A) and (B) of FIG. 14, the source lines SL and the bit lines BL are formed at the ends of the memory cell array. Each source line SL has the contact member SL_CT electrically connected to the source line of the N-type diffusion region 70, and each bit line BL has a contact member BL_CT electrically connected to the bit line of the N-type diffusion region 70. The memory cell array shown in FIG. 2B is formed in this way.

In the AND-type flash memory of this embodiment, unlike the conventional AND-type flash memory, the selection control line SGD/selection control line SGS and the word lines WL extending in the row direction can be formed together. Besides, instead of using a floating gate (FG) in the charge storage layer as in the past, a dielectric (SiN: silicon nitride layer) is used as the charge storage layer, so the steps for manufacturing memory cells can be simplified.

Besides, like the memory cells, forming bit line side selection transistor and the source line side selection transistor in the row direction (horizontal direction) between the opposite N-type diffusion regions 70 can improve the layout efficiency of the transistors and make the memory cell array highly integrated. Further, by forming the silicide region in the N-type diffusion region 70, the resistance of the N-type diffusion region 70 may be reduced, and the number of memory cells connected in parallel may thus be increased. Further, since the stacked insulator 50 including the charge storage layer is separated between memory cells, charge diffusion from one memory cell to an adjacent memory cell is prevented, and data retention is thus improved.

Figure 15A:
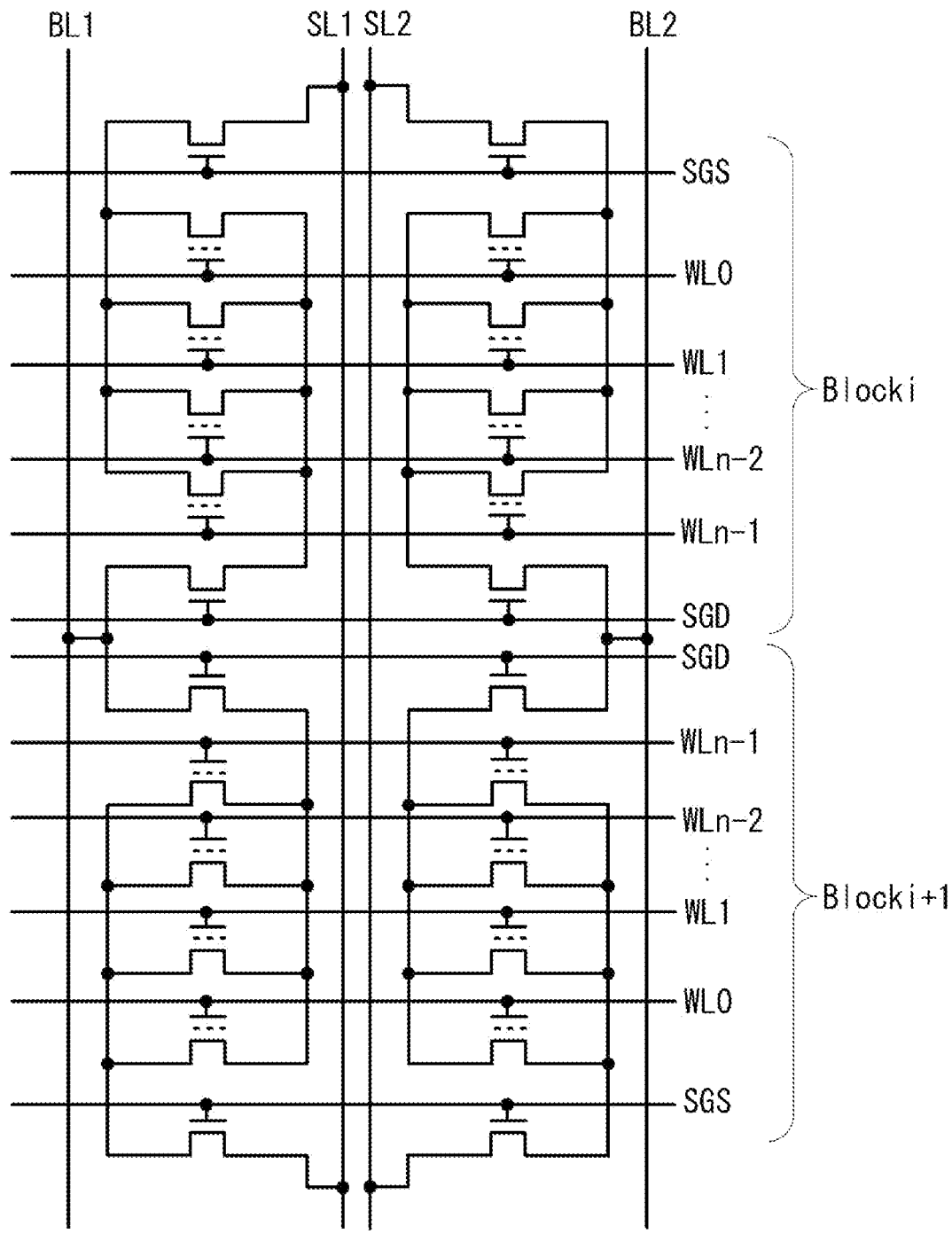
FIG. 15A is an equivalent circuit of the memory cell array of the AND-type flash memory including two blocks according to this embodiment.

Next, the equivalent circuit and operation of the AND-type flash memory of this embodiment is to be described as follows. The AND-type flash memory of this embodiment is a unique memory utilizing electron punch-through between a charge storage layer (e.g., SiN) and a channel. FIG. 15A illustrates an equivalent circuit of the memory cell array including two blocks. For instance, in Block i, n memory cells connected in parallel are connected in parallel between the bit line side selection transistor and the source line side selection transistor. The selection control lines SGS are connected to the gates of the upper selection transistors of Block i together, and the selection control lines SGD are connected to the gates of the lower selection transistors together. WL0, WL1, ..., and WLn-1 are connected to the gates of the memory cells in the row direction together.

One block is an erase unit of the cell array. One AND-type array includes a gate group (SGS, SGD, and WL0 to WLn-1) and a group of source lines SL and bit lines BL, and one block has multiple groups of source lines SL and bit lines BL.

The setting of the operating bias voltage of the memory cell array is shown in the table of FIG. 15B. The operations of reading/writing (programming)/erasing are performed in the selected block. "CG" has the same meaning as the word line WL, which is the control gate. Herein, it is assumed that the memory cell connected to CG1 of the selected block is selected. Like the two-dimensional NAND-type flash memory, reading and programming can be performed in word line units (page units), and erasing can be performed in block units. FIG. 15B shows the voltage applied to each part of the selected block and the unselected block at the time of reading, programming, and erasing.

[Read Operation]

In the case of each memory cell as a unit (single bit), approximately 4 V is applied to CG1 of the selected memory cell, approximately 0.6 V is applied to the bit line BL, and the source line SL is grounded for reading. −0.6 V to 0 V is applied to the CG of the unselected memory cell. A voltage higher than the threshold value Vt of the selection transistor is applied to the selection control line SGS/selection control line SGD. For instance, when the threshold value Vt of the memory cell connected to CG1 of the selected block is lower than the voltage applied to CG1, the cell current flows from the bit line BL to the source line SL. On the other hand, if the threshold value Vt of the memory cell connected to CG1 is higher than the voltage applied to CG1, current does not flow from the bit line BL to the source line SL. In order to correctly read the data of the memory cells, the threshold value Vt of the unselected memory cells must be higher than the CG bias voltage of the unselected memory cell.

FIG. 16 illustrates the current path from the bit line BL to the source line SL during the read operation. The source and the drain of the bit line side selection transistor are formed by the N+ diffusion region 70 along the source line SL and the bit line BL, and the channel is formed between the source and the drain below the selection control line SGD. For reading, a voltage higher than the threshold value Vt of the source line side selection transistor and the bit line side selection transistor is applied to the selection control line SGS and the selection control line SGD, and the source line side selection transistor and the bit line side selection transistor are turned on.

The current applied to the bit line BL flows in the N+ diffusion region 70 formed along the bit line BL via the contact member BL_CT. The current flowing in the N+ diffusion region 70 is separated by the P-type injection layer 40 in the region Q, so it does not flow to the N+ diffusion region 70 of the memory cell. As such, the current flowing in the N+ diffusion region 70 flows through the channel ("1" in FIG. 16) of the turned-on bit line side selection transistor and then passes through the N+ diffusion region 70 ("2" in FIG. 16) formed along the source line SL.

When the selected memory cell for reading is located on the word line WL1 and the voltage VWL1 of the word line WL1 is higher than the threshold value Vt of the memory cell, the current may pass through the channel ("3" in FIG. 16) under the word line WL1. If the voltage VWL1 of the word line is lower than the threshold value Vt of the memory cell, no current flows.

The current flowing through the channel of the word line WL1 flows in the N+ diffusion region 70 formed along the bit line BL ("4" in FIG. 16). Finally, the current passes through the channel of the turned-on source line side selection transistor ("5" in FIG. 16) and becomes a path to flow to the source line SL through the N+ diffusion region 70 and the contact member SL_CT. Herein, the current path between the two adjacent N+ diffusion regions 70 in the region Q is also blocked by the barrier of the P-type injection layer 40.

Figure 17:
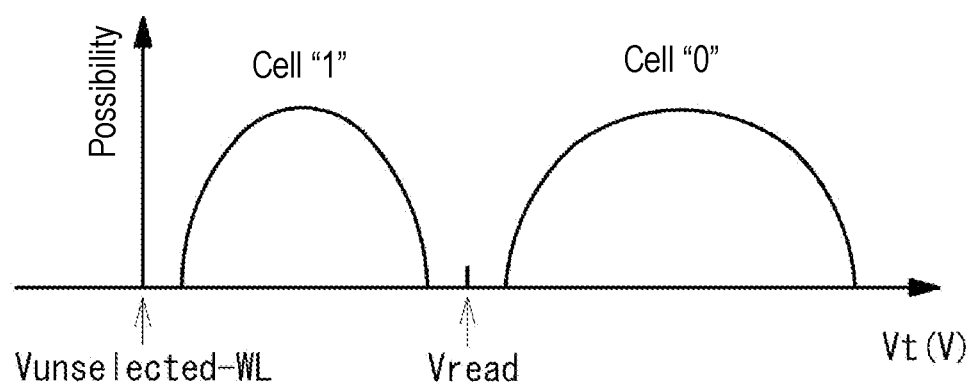
FIG. 17 is a plot illustrating distribution of threshold values of memory cells of the AND-type flash memory according to this embodiment.

In order to avoid leakage paths from other memory cells (word line WL0 and word line WL2 to word line WLn-1), the threshold value Vt of these memory cells must be higher than the bias voltages −0.6 V to 0 V) of these word lines. That is, as shown in FIG. 17, the threshold value Vt of the memory cell must be set higher than Vunselected. In addition, when the source line SL is made positive at approximately 0.2 V at the time of reading, the threshold value of the memory cell increases due to the substrate bias effect. In addition, therefore, as shown in FIG. 17, between the threshold distribution of memory cells storing "1" (memory cells in the erase state) and the threshold distribution of memory cells storing "0" (memory cells in the programming state), there must be a voltage $V_{read}$ applied to the selected word line for readout. In the table of FIG. 15B, the voltage $V_{read}$ applied to the selected word line is up to 4V, and the voltage $V_{unselected\text{-}WL}$ applied to the unselected word line is −0.6V to 0V. However, the abovementioned value is an example and can be changed. Further, in order to suppress the leakage current of the unselected block, the selection control line SGS/selection control line SGD of the unselected block is grounded.

[Programming Operation]

During programming, a high voltage (e.g., 8 V to 14 V) is applied to the selected CG1, and an intermediate voltage (e.g., 5 V to 7 V) is applied to the unselected CGs. In the case of "0" programming (injection of electrons into the charge storage layer), 0 V is applied to the bit lines BL, and the same voltage as that applied to the bit lines BL is also applied to the source lines SL. In the case of "1" programming (when electrons are not injected into the charge storage layer and programming is prohibited), a positive voltage (e.g., up to 1.6 V) is applied to the bit lines BL, and the same voltage as that applied to the bit lines BL is also applied to the source lines SL.

In "0" programming, a voltage higher than the threshold value Vt (e.g., up to 1 V) of the selection transistor is applied to the selection control line SGD to turn on the selection transistor and electrically connect the bit lines BL to the N+ diffusion region 70. A voltage (up to 1.5 V) higher than the threshold value Vt (e.g., up to 1 V) of the selection transistor is also applied to the selection control line SGS. Therefore, electrons punched through from the channel are injected into the charge storage layer of the selected memory cell, and the electrons are stored in the charge storage layer. Since the gates of the unselected memory cells are applied with an intermediate voltage that is not sufficient for punch-through from the channel, "0" programming is not performed.

In "1" programming, since a positive voltage is applied to the bit lines, even if a high voltage is applied to the selection control line SGD, the selection transistor is turned off, and the N+ diffusion region 70 is in a floating state. In addition, since the source lines are also applied with a positive voltage, the selection transistor is turned off. Therefore, when a high voltage is applied to CG1 and an intermediate potential between CG1 and 0 V is applied to other CGs, the potentials of the diffusion region and the channel are self-boosted by coupling, and the potential difference between the channel and the charge storage layer does not become large enough for punch-through. Therefore, no programming is performed in selected memory cells or unselected memory cells.

In addition, 0 V is applied to the selection control line SGS and the selection control line SGD of the unselected block to turn off the selection transistor and separate the N+ diffusion region 70 of the memory cell from the source lines SL/bit lines BL.

In one embodiment, the stacked insulator 50 includes at least three insulating layers. The first is the lower insulating layer (e.g., an oxide layer) facing the silicon surface, the second is the SiN layer that stores charges for data identification, and the third is the upper insulating layer (e.g., oxide layer) facing the gate/word lines WL. The effective oxide thickness of the lower insulating layer is thinner than the effective oxide thickness of the upper insulating layer, or vice versa. However, in this case, the charge flow to the SiN layer differs between programming and erasing. In the case where the effective oxide film thickness of the lower insulating layer is thin, charges flow between the silicon surface and the SiN layer during programming and erasing. On the other hand, in the case where the thicknesses of the insulating layers are opposite, charges flow between SiN and the gate/word lines WL during programming and erasing.

Herein, as a representative example, the first case (thickness of the lower insulating layer is thinner than that of the upper insulating layer) is described as follows. When the bit line BL is grounded, the memory cell connected to CG1 is programmed with "0" (electron injection from the channel to the SiN layer). When a positive voltage (up to 1.6 V) is applied to the bit lines BL and the source lines, the two N+ diffusion regions 70 on the source line side and the bit line side are separated from the bit lines BL and the source lines SL. Therefore, both the diffusion regions 70 and the channel region are self-boosted by applying a high voltage and an intermediate voltage to CG1 and other CGs, the voltage difference between the diffusion regions 70 and CG1 becomes small, and electron injection from the substrate to the SiN layer does not occur in the memory cell connected to CG1.

In the case of erasing, the memory cells of the selected block are erased together. The two wells, the n well and the p well formed in the substrate, are electrically connected. During the erasing process, a high voltage (e.g., 8 V to 14 V) is applied to the p well, all CGs in the selected block are grounded, so the bit lines BL and the source lines SL float. Electrons then punch through from the SiN layer to the p well, or electron holes are injected from the p well into the SiN layer of the memory cell and recombine with the electrons. Accordingly, the threshold value Vt of the memory cell is lower than the read voltage applied to the selected CG during the read operation. On the other hand, in unselected blocks, all CGs are floating. When a high voltage is applied to the p well, the floating CG is self-boosted and no erasure occurs in the unselected blocks. In addition, erasure is preferably performed in units of blocks, but it may also be performed in units of word lines.

Figure 18:
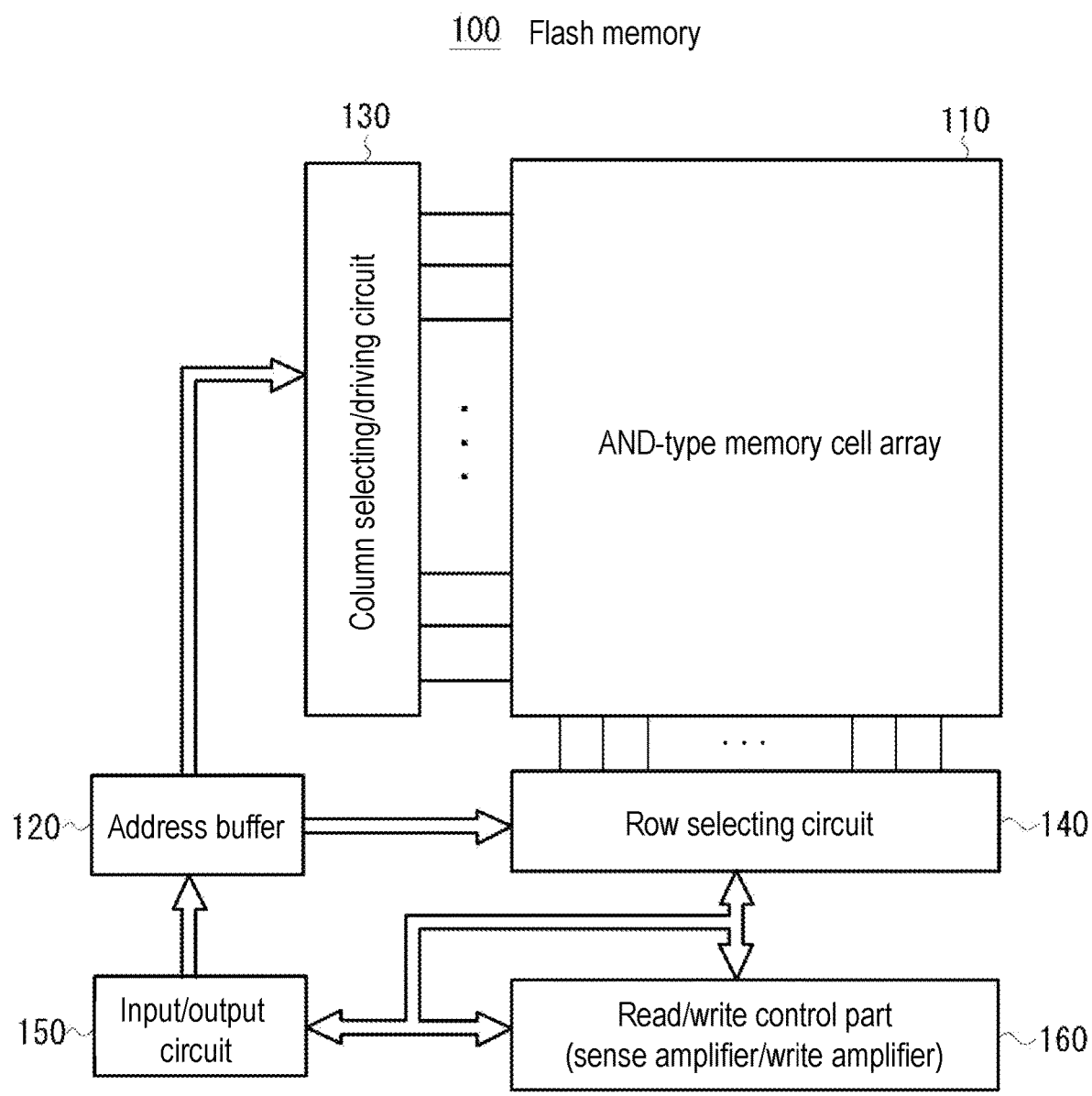
FIG. 18 is a block diagram of an electrical structure of the AND-type flash memory according to an embodiment of the disclosure.

FIG. 18 is a block diagram of a min electrical structure of the AND-type flash memory according to this embodiment. As shown in FIG. 18, the flash memory 100 includes a memory cell array 110, an address buffer 120, a column selecting/driving circuit 130, a row selecting circuit 140, an input/output circuit 150, and a read/write control part 160. The memory cell array 110 has an AND-type memory cell array structure. The address buffer 120 holds an externally-inputted address and the like. The column selecting/driving circuit 130 selects a word line and the like based on a column address and drives the selected word line and the like. The row selecting circuit 140 selects a bit line or a source line and the like based on a row address. The input/output circuit 150 sends and receives data or a command to and from an external host or a device and the like. The read/write control part 160 senses data read from a selected memory cell during a read operation, applies a bias voltage for writing into the selected memory cell to a bit line or the like during a programming operation, or applies an erase voltage and the like to a p well and the like during an erase operation. These parts are connected by an internal bus capable of sending and receiving addresses, data, control signals, and the like. In addition, although not shown herein, a voltage generating circuit for generating various bias voltages and the like are included.

The column selecting/driving circuit 130 selects a word line WL based on the column address and drives the selected word line WL and an unselected word line with a voltage corresponding to the operation. The column selecting/driving circuit 130 applies a voltage as shown in FIG. 8B to the word line WL (CG) and the selection control line (SG). The column selection circuit 140 selects a bit line BL and a source line SL based on the row address, and applies a voltage corresponding to the operation to the selected bit line BL and the source line SL, or makes the bit line BL and source line SL into a floating state.

The read/write control part 160 controls operations such as reading, programming, and erasing according to a command received from an external host device. The read/write control part 160 includes a sense amplifier, a write amplifier, and the like. The sense amplifier senses the current and voltage flowing in the bit line BL and the source line SL connected to the selected memory cell during the read operation. The write amplifier applies a read voltage to the selected bit line during the read operation and applies a voltage to the selected bit line or the unselected bit line during the programming operation, so as to make the bit line or the source line a floating state during the erase operation.

Figure 19:
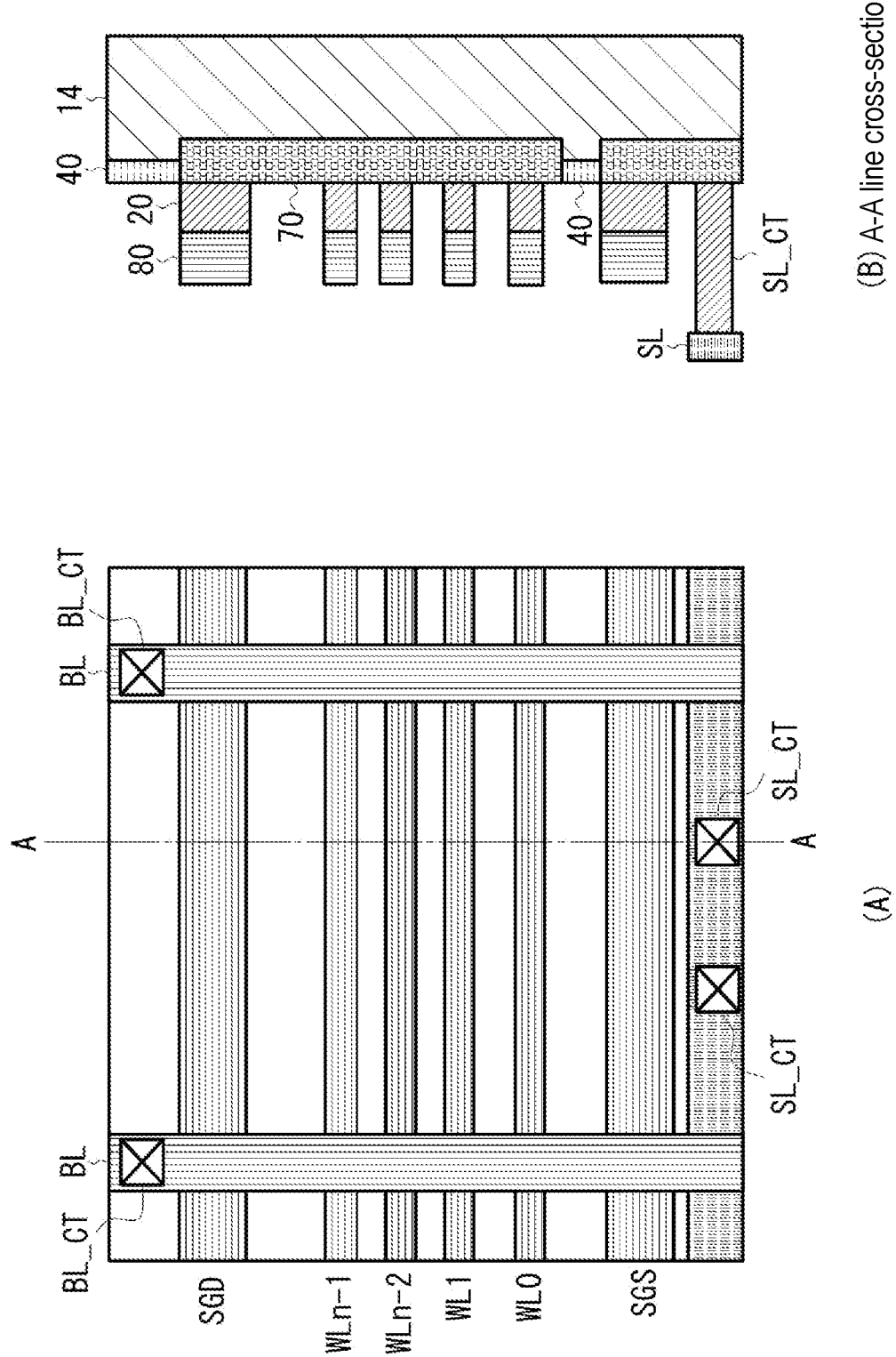
In FIG. 19, (A) is a schematic plan view of a memory cell array of an AND-type flash memory according to another embodiment of the disclosure, and (B) is a cross-sectional view taken along the line A-A in (A).

In FIG. 19, (A) is a schematic plan view of a memory cell array of an AND-type flash memory according to this embodiment, and (B) is a cross-sectional view taken along the line A-A in (A). As shown in the figure, the common source line SL extends in the row direction together with the word lines WL and the selection control line SGS/SGD, and the bit lines BL extend in the column direction so as to be perpendicular to the common source line SL.

In a specific configuration, the word lines WL and selection control line SGS/selection control line SGD are formed of first-level metal wiring, and the common source line SL is formed by the second-level metal wiring closer to the upper layer than the first-level. Accordingly, the common source line SL is connected to the diffusion regions (or metal silicide regions) of the source line side selection transistor of a plurality of blocks together in the row direction through the contact member SL_CT.

The process steps before forming the bit lines BL and the source line SL are the same as the previous embodiments. In addition, the bit lines BL are formed on the upper layer of the common source line SL, but this relationship may be reversed, and the common source line SL may be formed on the upper layer of the bit line BL.

Figure 20:
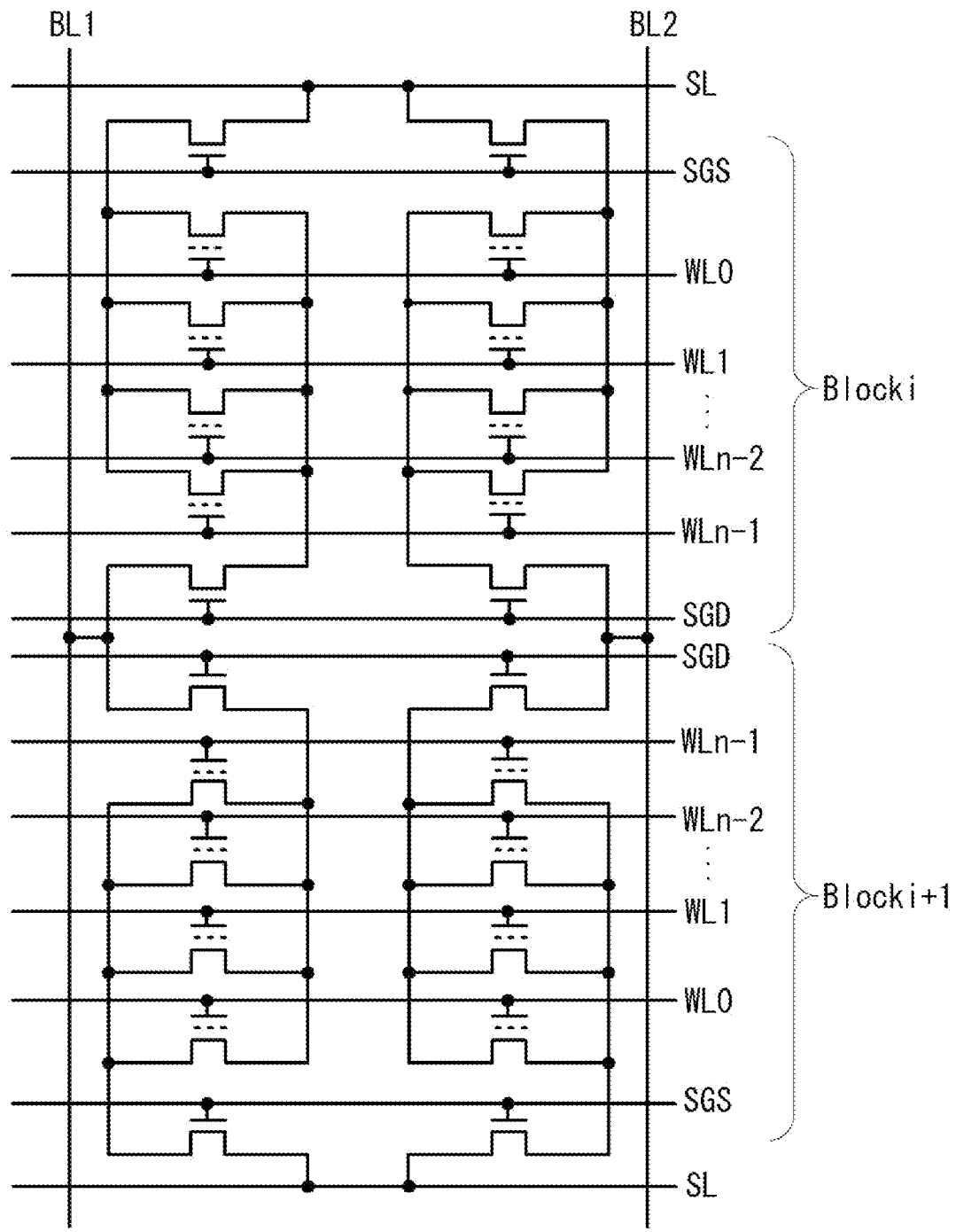
FIG. 20 is an equivalent circuit of a memory cell array of an AND-type flash memory including two blocks according to another embodiment.

FIG. 20 is an equivalent circuit of a memory cell array of an AND-type flash memory including two blocks according to this embodiment. The difference from the equivalent circuit (FIG. 15A) of the previous embodiment is that the common source lines SL extends parallel to the word lines WL and are connected to a plurality of blocks in the row direction together.

FIG. 21 is a table representing setting examples of application of operating bias voltages to each part of the AND-type flash memory according to this embodiment. The difference from the operating bias (FIG. 15B) of the previous embodiment is the potential of the selection control line SGS and the common source line SL at the time of writing. That is, the selection control line SGS is set to 0 V, and the source line side selection transistor connected to the selection control line SGS is turned off. In addition, by setting the potential of the source line SL to 0.5 V to 1 V, the self-boosted potential of the channel portion is prevented from penetrating the source line SL at the time of "1" programming.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A flash memory, which is an AND-type flash memory and comprises a memory cell array, wherein the memory cell array comprises a plurality of memory cells, and the plurality of memory cells are connected in parallel between a source line and a bit line, wherein the flash memory comprises:
   a plurality of diffusion regions formed in a substrate in a column direction;
   a plurality of gates formed between the opposite diffusion regions;
   a first selection control line connected to each gate of a bit line side selection transistor in a row direction;
   a second selection control line connected to each gate of a source line side selection transistor in the row direction; and
   a plurality of word lines connected to gates of the memory cells in the row direction,
   wherein each of the bit line side selection transistor, the source line side selection transistor, and the plurality of memory cells has a channel area in the row direction, and the diffusion regions comprise:
- a first isolation region electrically isolating a diffusion region of the bit line side selection transistor from a diffusion region of the memory cell adjacent to the bit line side selection transistor; and
- a second isolation region electrically isolating a diffusion region of the source line side selection transistor from a diffusion region of the memory cell adjacent to the source line side selection transistor, wherein the first isolation region and the second isolation region have a different conductivity type from other diffusion regions.

2. The flash memory according to claim 1, wherein the diffusion regions of the bit line side selection transistor and the source line side selection transistor are separated from the diffusion regions of the plurality of memory cells.

3. The flash memory according to claim 1, further comprising a plurality of bit lines and a plurality of source lines formed on the substrate along the diffusion regions, the bit lines are electrically connected to the diffusion region of the bit line side selection transistor through a contact member, and the source lines are electrically connected to the diffusion region of the source line side selection transistor through a contact member.

4. The flash memory according to claim 1, wherein the diffusion regions comprise a metal silicide region.

5. The flash memory according to claim 1, wherein an element isolation region is formed between two opposite diffusion regions in each of the memory cells and two opposite diffusion regions in another memory cell adjacent to the memory cell.

6. The flash memory according to claim 1, wherein each of the memory cell comprises a stacked insulator comprising at least three layers or more between the gate and the substrate, and the stacked insulator comprises a charge storage layer, wherein the stacked insulators are separated in units of each memory cell.

7. The flash memory according to claim 6, wherein when a program voltage is applied to a gate of a selected memory cell, the charge storage layer stores charges from a channel through Fowler-Nordheim (FN) punch-through.

8. The flash memory according to claim 6, wherein when an erase voltage is applied to a well region, the charge storage layer releases stored charges into a channel through punch-through.

9. The flash memory according to claim 1, wherein the flash memory further comprises a plurality of bit lines and a plurality of source lines formed on the substrate along the diffusion regions, the bit lines are electrically connected to the diffusion region of the bit line side selection transistor through a contact member, and the source lines are parallel to the word lines and are electrically connected to the diffusion region of the source line side selection transistor through a contact member.

10. The flash memory according to claim 9, wherein the memory cell array comprises a plurality of blocks arranged in a matrix direction, and the source lines are connected to the plurality of blocks in the row direction together.

11. The flash memory according to claim 6, wherein the charge storage layer comprises a dielectric.

12. The flash memory according to claim 6, wherein the stacked insulator further comprises:
- a first insulating layer between the charge storage layer and the substrate; and
- a second insulating layer, wherein the charge storage layer is between the first insulating layer and the second insulating layer, and
- a thickness of the first insulating layer is different from a thickness of the second insulating layer.

13. The flash memory according to claim 1, wherein the bit line side selection transistor and the source line side selection transistor are formed in the row direction between the opposite diffusion regions.

14. The flash memory according to claim 9, wherein the plurality of word lines and the first and second selection control lines are formed of a first-level metal wiring, and the plurality of source lines are formed of a second-level metal wiring above the first-level metal wiring.

15. The flash memory according to claim 1, wherein the opposite diffusion regions where the plurality of gates formed therebetween are staggered with each other in the row direction.

16. The flash memory according to claim 1, further comprising:
- an injection layer under the plurality of gates has the conductivity type as the first isolation region and the second isolation region.

* * * * *